United States Patent [19]
Goossen

[11] Patent Number: 5,962,846
[45] Date of Patent: Oct. 5, 1999

[54] REDUNDANT LINEAR DETECTION ARRAYS

[75] Inventor: Keith Wayne Goossen, Aberden, N.J.

[73] Assignee: Lucent Technologies Inc., Murray Hill, N.J.

[21] Appl. No.: 08/920,945

[22] Filed: Aug. 29, 1997

[51] Int. Cl.[6] ................................................. H01J 40/14
[52] U.S. Cl. ................................ 250/214.1; 250/208.1; 250/208.2; 345/93; 348/246
[58] Field of Search ............................. 250/214.1, 214.5, 250/208.1, 208.2, 208.4; 327/526; 345/93; 248/246

[56] References Cited

U.S. PATENT DOCUMENTS

| 4,546,243 | 10/1985 | Hamano et al. ................... | 250/211 R |
| 4,659,920 | 4/1987 | Nishiura et al. .................... | 250/211 J |
| 4,661,713 | 4/1987 | Besson et al. ...................... | 250/578 |
| 4,728,802 | 3/1988 | Baron ................................. | 250/578 |
| 4,785,191 | 11/1988 | Ondris ............................... | 250/578 |
| 5,111,060 | 5/1992 | Asada ................................ | 307/219 |
| 5,291,293 | 3/1994 | Kapan ............................... | 348/246 |

*Primary Examiner*—Edward P. Westin
*Assistant Examiner*—Thanh X. Luu
*Attorney, Agent, or Firm*—Gibbons, Del Deo, Dolan, Griffinger & Vecchione

[57] ABSTRACT

A detector array for detecting an optical signal includes a plurality of pixels. Each pixel has a plurality of detector elements coupled together in a redundant configuration such that the detector array maintains a substantially uniform response even if each of the pixels includes a number of defective detector elements. The optical signal is lengthened in the direction normal to the information vector, so that each detector element is exposed to the same portion of the optical signal. A bad-element sensor is coupled to each detector element, which is functionally responsive to the detection of a bad detector element.

21 Claims, 3 Drawing Sheets

REDUNDANT LINEAR DETECTION ARRAYS

FIELD OF THE INVENTION

This invention relates to optical detectors and in particular, to detector arrays.

BACKGROUND OF THE INVENTION

Photodetector array's are becoming increasingly important in lightwave communication systems due to parallel optical data links and wavelength division multiplexing. For example, photodetector arrays are employed in photospectrometers to read out the spectrum generated by a dispersive medium such as a grating. In these contexts, the array is typically one-dimensional. However, the functionality of these linear detector arrays is effected by the presence of bad detectors. For fiber optic communication at a wavelength of 1.55 µm, 1×12 arrays of InGaAs/InP photodiodes have been fabricated and substantially uniform 1×12 arrays have been demonstrated. In addition, 1×512 arrays have been demonstrated with a reported yield that was approximately 98%. In the latter case, bad devices were found to be almost exclusively leaky, and usually caused by a defect in the epitaxial growth of the devices. That is, microscopic point defects that occurred during fabrication resulted in devices that exhibited excess photodiode leakage. As a consequence, defects which result in shorts and opens are a primary limitation on device yield.

Fabrication of two-dimensional arrays integrated with Si CMOS to form arbitrary circuit formations have been demonstrated. The integration technology utilized in fabricating these devices was flip-chip bonding. As a consequence, the size of the array is fairly unrelated to the difficulty in fabricating the chip, and thus a chip can have for example, as many as 10,000 elements. Arrays of GaAs/AlGaAs photodiode/modulators operating at 850 nm and having as many as 4,352 elements have been produced. The yield of these devices were measured to be approximately 99.95%. This result is presumably due to the higher quality of GaAs/AlGaAs material than InGaAs/InP material.

Accordingly, there is a need to provide a simple and effective apparatus and method which improves device functionality and uniformity by utilizing photodiode redundancy in detector arrays.

SUMMARY OF THE INVENTION

The present invention teaches an apparatus and method which substantially increases photodetector array uniformity and functionality by introducing redundancy into the array configurations. Importantly, redundancy is utilized to counter the presence of bad photodiodes.

In an exemplary embodiment of the present invention, a detector array has M optical pixels. The present structure advantageously utilizes N detector elements in each optical pixel to reduce the effect of bad detector elements on array functionality. The detector array further includes means for lengthening the optical spot on the array in the direction normal to the information vector. As a consequence, each of the N detector elements in a specific optical pixel is exposed to the optical spot. That is, each optical pixel is represented by a column of detector elements, each of which looks at an optical signal that covers the entire column. A bad-element sensor is coupled to each of the detector elements and is functionally responsive to a defective detector element. If a fuse or switch is utilized as the bad-element sensor, it can be set either by physical action or electrical input to disable a bad detector. Moreover, the fuse can automatically sense bad diodes by setting $V_{Bm}$ and looking for the presence of dark current. In a further embodiment, a current limiter is utilized as the bad-element sensor to limit the current at the maximum expected value of the photocurrent. This prevents a potentially leaky diode from overloading connected circuitry, for example, an amplifier.

Advantageously, there is disclosed a photodiode array wherein subsets of the arrays are treated as single pixels of an optical system. In particular, an exemplary embodiment of a photospectrometer is illustrated where each of the columns of a two-dimensional array is treated as one pixel of a one-dimensional optical system. The above factors make the present invention redundancy a versatile and efficient method for increasing the uniformity of the system in response to photodiode yield reductions due to process defects.

BRIEF DESCRIPTION OF THE DRAWINGS

A more complete understanding of the present invention may be obtained from consideration of the following description in conjunction with the drawings in which.

DETAILED DESCRIPTION

In general, the present invention mitigates the effects of bad detector elements in a photodetector array. This is achieved by utilizing detector element redundancy in the photodetector array. For example, if a photodetector array has M optical pixels, then each optical pixel is comprised of N detector elements to reduce the effect of bad detector elements on array functionality. By lengthening the optical signal in the direction normal to the information vector, each detector element is exposed to the same portion of the optical signal. That is, each optical pixel is represented by a column of detector elements, each of which looks at an optical signal that covers the entire column. In other words, each subset of detector elements of the array is treated as a single pixel of the optical system, where each subset collects a redundant optical signal. For example, in a photospectrometer, each column of a two-dimensional array is treated as one pixel of a one-dimensional optical system. The present invention detector array includes a bad-element sensor, which is responsive to the detection of a bad detector element.

Figure 1:
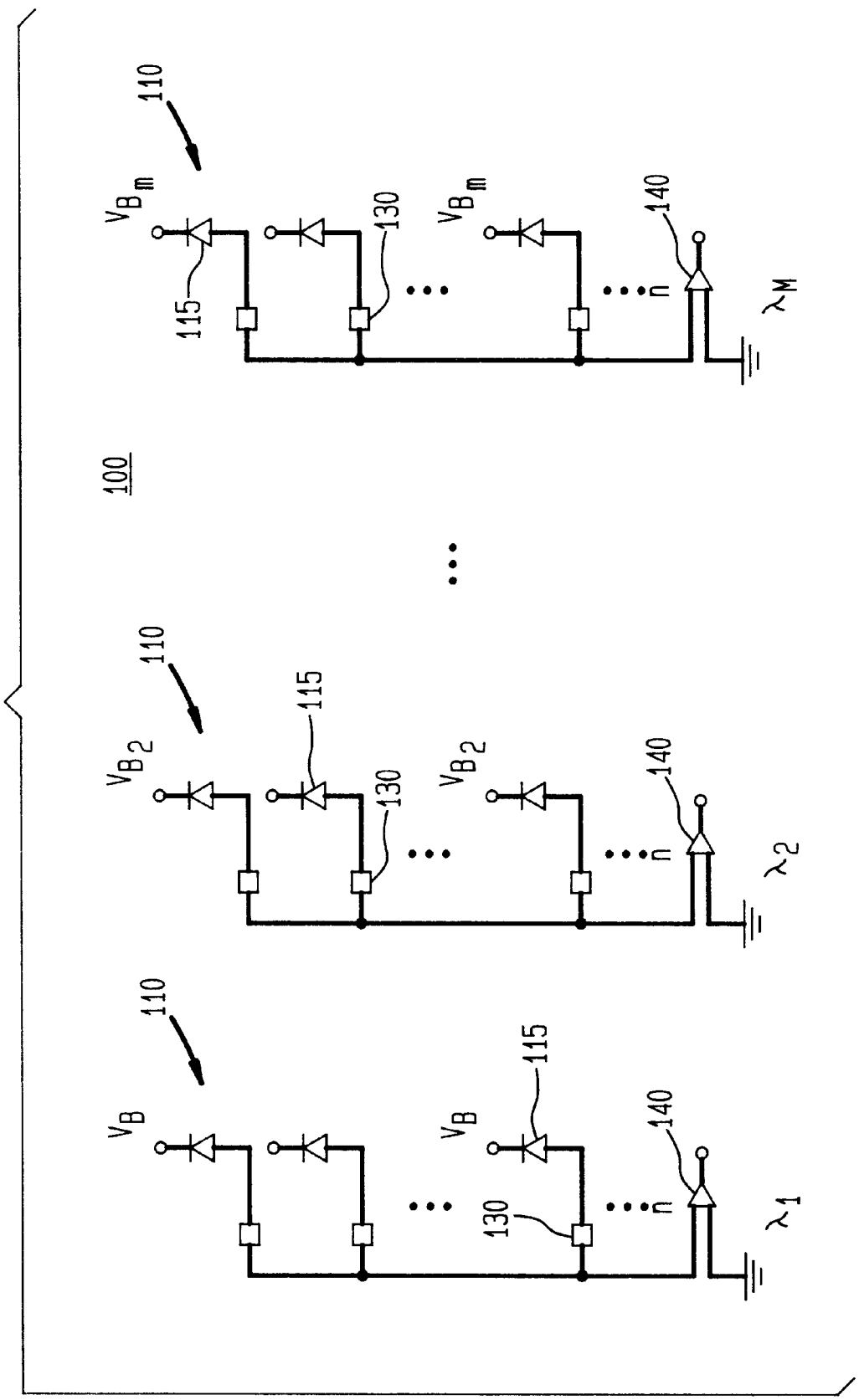
FIG. 1 is an exemplary embodiment of a redundant linear detector array in accordance with the present invention.

FIG. 1 illustrates an exemplary embodiment of a present invention detector array 100 which is utilizable in an optical system. In the exemplary embodiment, detector array 100 is a linear detector array, such as those utilized in spectrometers where the optical information or signal is presented along one dimension. Detector array 100 is comprised of M optical pixels 110, each of which is coupled to an amplifier circuit, for example, an amplifier 140. As such, each optical pixel 110, for example, corresponds to a different frequency in an optical signal. Each of the M optical pixels 110 is comprised of N detector elements 115 connected in parallel. That is, N detector elements 115 exist for each optical pixel 110 and are each illuminated by the optical signal. Uniform illumination is achieved by lengthening the optical signal or spot present on the array in a direction normal to an information vector. N detector elements 115 are, for example, photodiodes operated with zero applied bias or reverse applied bias.

Figure 2:
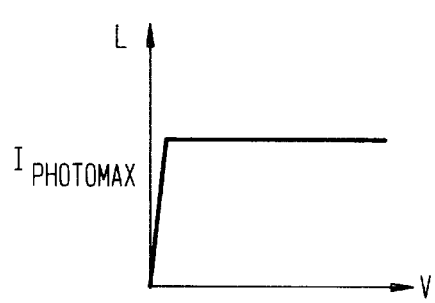
FIG. 2 is an illustration of limiter utilized in accordance with the present invention.

Detector array 100 further includes a bad-element sensor 130 which is functionally responsive to a bad detector element in the detector array. Bad-element sensor 130 can be either a fuse, switch or current limiter. In one embodiment, bad-element sensor 130 is a fuse or a switch, which is setable either by a physical action or an electrical input to disable the bad detector. In the case of a detector which is defective in the open sense, the fuse or switch need not be set. In a further embodiment, the fuse automatically senses bad diodes by setting $V_{Bm}$ and looking for the presence of dark current. As shown in FIG. 2, in a further embodiment, a current limiter is utilized as bad-element sensor 130 to limit the current at the maximum expected value of the photocurrent. This prevents a potentially leaky diode from overloading connected circuitry, for example, such as an amplifier.

If the same optical information is presented to a particular area of a chip, the concept is to have several photodetectors in the same area rather than just having one photodetector in that area. This is most easily appreciated in optical systems where the information in the optical beam changes along one axis of the chip, for example, in a photospectrometer. Prior to the present invention, a simple one-dimensional array would have been employed for a photospectrometer. However, the present invention utilizes a two-dimensional array, where diodes along the axis normal to the optical information change are coupled together so that if one diode is bad then the other diodes can still perform the function of optical detection. This results in uniform operation of the photodetector array. As stated above, the optical spot for a single wavelength must be lengthened in the direction normal to the dispersion so that it illuminates the redundant photodiodes uniformly.

The resulting improvement in the functionality of the array depends on how the array is operated and the nature of the photodiode yield reduction. That is, is the defect an open or short. The simplest case to examine is where the yield reduction results from an open circuit of the photodiode. In this case, if the redundant photodiodes are simply connected in parallel to a preamplifier, the photocurrent measured for one bad diode will be reduced by (N−1)/N, where N is the number of redundant diodes. It is arguable that redundancy does not help much in the case of open photodiodes. This occurs because open photodiodes are probably due to lithography defects in metalization or missing solder bumps, and these types of defects increase as the area of the photodiode is made smaller. An alternative approach is to think of redundancy as a single large diode which is parsed into several smaller ones. This approach is supported by the fact that it is desirable that the size of the optical spot, or the overall capacitance of the redundant diodes, should remain constant. Then, the probability of open photodiodes increases only as the redundancy number is increased. As a consequence, it would seem to be better to use a single large diode in this case.

Although the open case is one reason for decreased yield, a more prevalent factor in yield reduction is leaky photodiodes. As before, the benefits of redundancy is dependent upon how the array is operated. Although it is probably not feasible to have a separate preamplifier for each redundant diode, it is beneficial when the redundancy is implemented by coupling the redundant photodiodes in parallel. Moreover, when a leaky diode is identified and removed from the circuit either by physical (e.g., laser ablation) or electronic action (e.g., via a fuse or switch), the measured photocurrent is reduced by (N−1)/N.

Operationally, photodiodes are operated with zero applied or reverse applied bias. The latter configuration is typically utilized when speed is a factor in the overall operation. However, dark current leakage usually increases as reverse applied bias is increased. For reverse biased photodiodes, the simplest way to take advantage of redundancy is to place a current limiter in series with each photodiode. The limit would be set at the maximum photocurrent anticipated from each diode as previously shown in FIG. 2.

If operational speed is unimportant, as in a photospectrometer, the photodiodes may be operated at zero applied bias, e.g., at the virtual ground of a current/voltage converter circuit. Then, the photodiodes may be connected in parallel, with no need to limit dark current, since there can be none at zero applied bias. This advantage is due to the fact that leaky photodiodes have reduced photocurrent at zero bias.

Figure 3A:
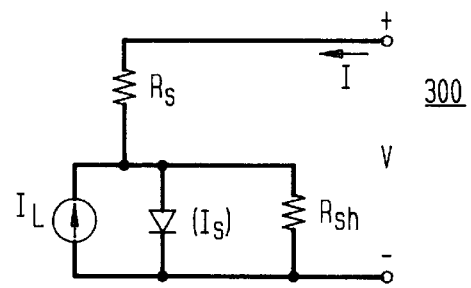
FIG. 3(a) is a circuit model for a single leaky diode in accordance with the present invention.

Referring to FIG. 3(a), this phenomena is demonstrable using a circuit model 300 for a photodiode containing both shunt $R_{SH}$ and series $R_S$ resistances. In FIG. 3(a), $I_L$ is the photocurrent, and the current through the diode element is given by $I_S(e^{qV/kT}-1)$. It is then straightforward to calculate I vs. V, and observe the reduction in I at zero bias as the series resistance is raised above zero and/or the shunt resistance is lowered from infinity.

Figure 3B:
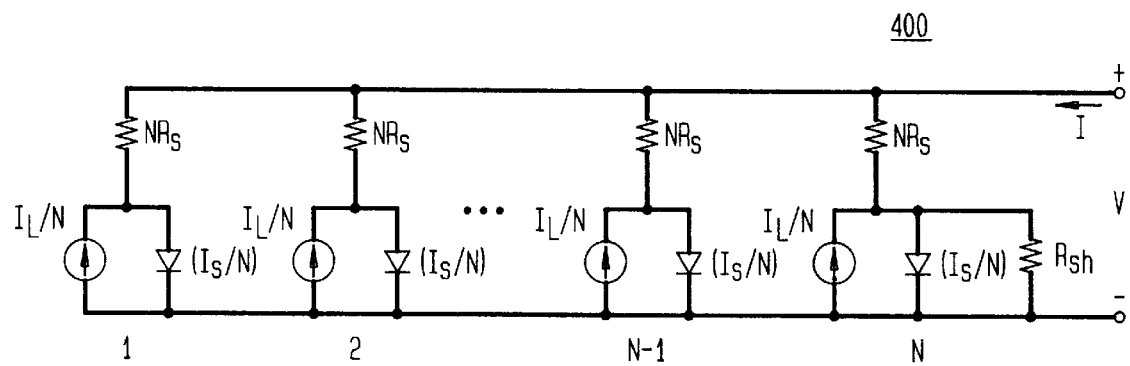
FIG. 3(b) is a circuit model for a redundant array of N photodiodes in accordance with the present invention.

Referring now to FIG. 3(b), a circuit model 400 is presented upon which the same type of analysis is performed when utilizing redundant photodiodes. Several assumptions were made in performing the analysis. First, a single large diode was replaced by N smaller diodes, where the total area utilized was kept constant. Furthermore, it was assumed that each photocurrent source was reduced by 1/N, and that each diode element's current was also reduced by 1/N. In addition, the assumption was made that the series resistance of the smaller diodes is N times that of the large diode, due to the smaller area available for contact. It was also assumed that the shunt conductance of the large diode can be isolated in one of the smaller, parsed diodes since the conductance results from a point defect in the crystal.

Figure 4:
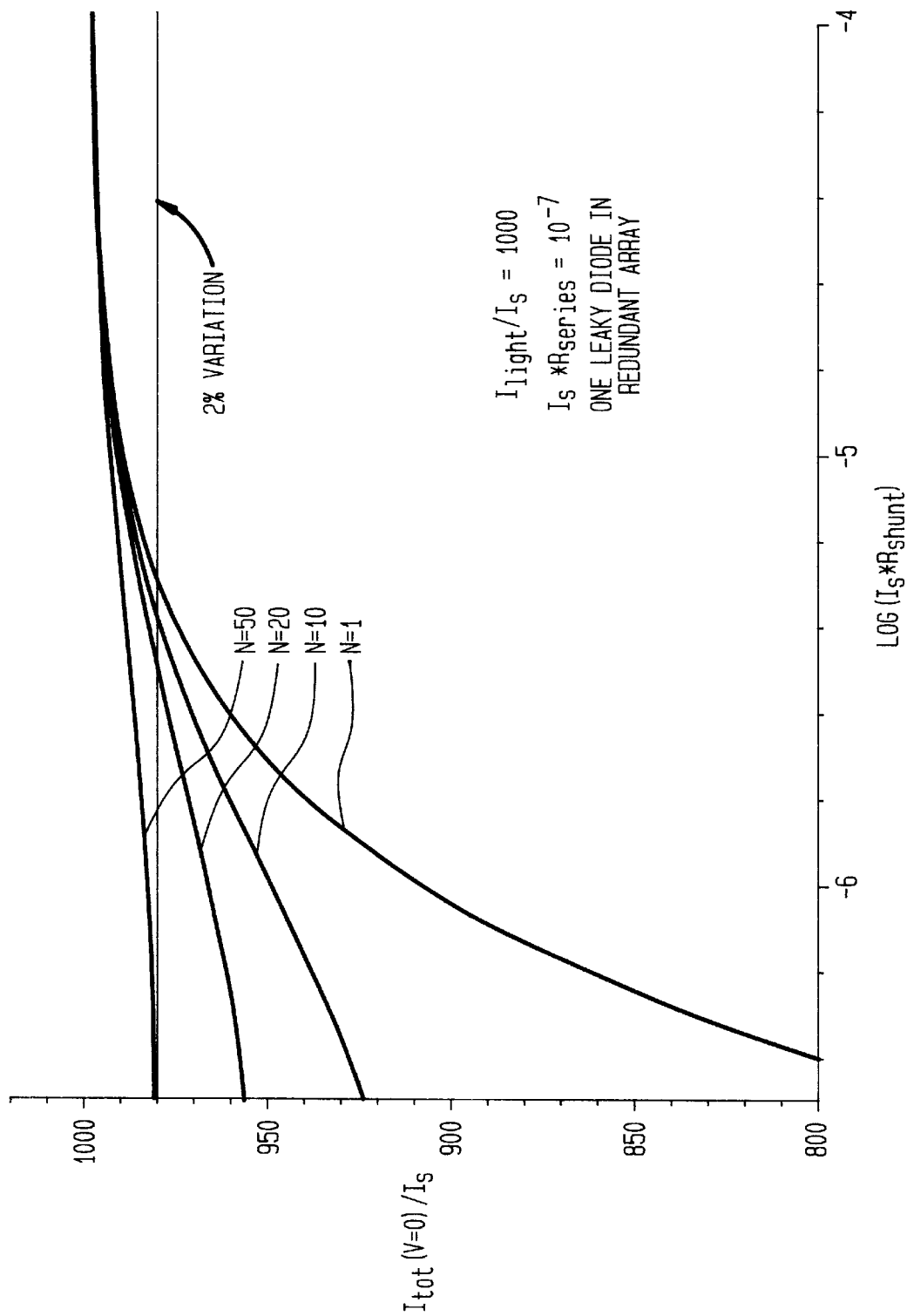
FIG. 4 are plots of illuminated, zero-bias current photodiodes utilized in a redundant array of photodiodes in accordance with the present invention.

The analysis of the redundant circuit is then a matter of summing the currents from each photodiode, since the photodiodes are connected to a virtual ground. Referring to FIG. 4, a plot illustrates the resulting zero-bias current for the case of $I_L/I_S=1000$ and $I_SR_S=10^{-7}$, as a function of $I_SR_{SH}$, for N=1, 10, 20, and 50. In the case of $I_S=1$ nA, this would correspond to 1 $\mu$A of photocurrent, and a series resistance of 1 kΩ. A photodetector array is specified by the uniformity of its elements. That is, an element is considered "bad" if its performance falls below a certain specified uniformity of the array. What is illustrated in FIG. 4 is that redundancy is particularly useful if the number of redundant photodiodes is greater than the inverse of the specified uniformity. For example, if in FIG. 4, the specified uniformity of the array is <2% variation, a single large diode fails for $I_SR_{SH}=10^{-5.3}$, or, for $I_S=1$ nA, and a shunt resistance of 5 kΩ. As the redundancy N is raised to 10 and then 20, the corresponding shunt resistance for failure only drops to 4 kΩ and 3 kΩ, respectively. Although this represents an improvement, the corresponding shunt resistance for failure drops to 1Ω when N=50.

Presented herein is the utilization of redundancy in photodiode arrays, and in particular for two-dimensional arrays where photodiodes along one dimension are grouped together, thus forming an effective one-dimensional array. The immunity of the redundant array to a leaky diode increases only marginally until the number of redundant photodiodes is raised above the inverse of the specified uniformity of the overall array, at which point it increases dramatically.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications which come within the scope of the appended claim is reserved.

What is claimed:

1. An optical system including a detector array which is illuminated by an optical signal, said system comprising:
   a plurality of optical pixels responsive to optical illumination; and
   N detector elements coupled together in a redundant configuration to form each of said plurality of optical pixels, N being greater than an inverse of a given level of uniformity for said detector array;
   wherein said detector array maintains a substantially uniform response when said N detector elements include a number of defective detector elements.

2. The system according to claim 1, further including a bad-element sensor coupled to each of said N detector elements, wherein said bad-element sensor is functionally responsive to detection of a defective detector element.

3. The system according to claim 2, wherein said bad-element sensor is a fuse which is set upon detection of said defective detector element.

4. The system according to claim 2, wherein said bad-element sensor automatically senses said defective detector element by setting $V_B$ and looking for a presence of dark current.

5. The system according to claim 2, wherein said bad-element sensor is a switch which is set upon detection of said defective detector element.

6. The system according to claim 2, wherein said bad-element sensor is a circuit limiter which is set to a maximum expected value of photocurrent of said N detector elements to prevent overloading of circuitry coupled to said plurality of optical pixels.

7. The system according to claim 1, wherein said optical signal is lengthened in a direction normal to an information vector of said optical signal.

8. The system according to claim 7, wherein said redundant configuration requires said N detector elements to be coupled in a parallel configuration.

9. The system according to claim 1, wherein one of said N detector elements is considered defective if a performance level of said one is below a given level of uniformity of said detector array and wherein a value of said N is greater than an inverse of said given level of uniformity.

10. The system according to claim 1, wherein each of said N detector elements corresponds to a given wavelength and is equally illuminated by said optical signal.

11. The system according to claim 1, wherein said number of defective detector elements is less than said N detector elements.

12. A detector array for detecting an optical signal, said detector array comprising:
   a plurality of pixels responsive to optical illumination; and
   a plurality of detector elements coupled together in a redundant configuration to form each of said plurality of pixels, the number of said detector elements being greater than an inverse of a given level of uniformity for said detector array;
   wherein said detector array maintains a substantially uniform response even if each of said plurality of pixels includes a number of defective detector elements.

13. The detector array according to claim 12, further including a bad-element sensor coupled to each of said plurality of detector elements, wherein said bad-element sensor is functionally responsive to a presence of a defective detector element.

14. The detector array according to claim 13 wherein said bad-element sensor is selected from a group consisting of a fuse and a switch.

15. The detector array according to claim 13, wherein said bad-element sensor automatically senses said defective detector element by setting $V_B$ and looking for a presence of dark current.

16. The detector array according to claim 13, wherein said bad-element sensor is a circuit limiter which is set to a maximum expected value of photocurrent of said plurality of detector elements to prevent overloading of circuitry coupled to said plurality of pixels.

17. The detector array according to claim 12, wherein:
   said optical signal is lengthened in a direction normal to an information vector of said optical signal;
   said redundant configuration requires said plurality of detector elements to be coupled in a parallel configuration; and
   each of said plurality of detector elements corresponds to a given wavelength and is equally illuminated by said optical signal.

18. The detector array according to claim 12, wherein one of said plurality of detector elements is considered defective if a performance level of said one is below a given level of uniformity of said detector array and wherein a number of said plurality of detector elements is greater than an inverse of said given level of uniformity.

19. The system according to claim 12, wherein said number of defective detector elements is less than said plurality of detector elements.

20. A method for increasing uniformity of response in a detector array which is responsive to an optical signal, said detector array having a given number of optical pixels, said method comprising the steps of:
   selecting a given number of detectors for each of said given number of optical pixels such that said number of detectors is greater than an inverse of a given level of uniformity for said detector array, wherein one of said detectors is considered defective if a performance level of said one is below said given level of uniformity for said detector array; and,
   arranging said given number of detectors in a redundant configuration such that presence of a bad detector maintains said given level of uniformity for said detector array.

21. The method of according to claim 20, further comprising the step of coupling a bad-element sensor to each of said given number of detectors.

* * * * *